United States Patent [19]
Yusuki et al.

[11] Patent Number: 5,357,460
[45] Date of Patent: Oct. 18, 1994

[54] SEMICONDUCTOR MEMORY DEVICE HAVING TWO TRANSISTORS AND AT LEAST ONE FERROELECTRIC FILM CAPACITOR

[75] Inventors: Tatsushi Yusuki; Shigeo Onishi; Kenichi Tanaka, all of Nara; Keizo Sakiyama, Kashihara; Katsuji Iguchi, Koriyama, all of Japan

[73] Assignee: Sharp Kabushiki Kaisha, Osaka, Japan

[21] Appl. No.: 888,856

[22] Filed: May 27, 1992

[30] Foreign Application Priority Data

| May 28, 1991 | [JP] | Japan | 3-121520 |
| Jul. 17, 1991 | [JP] | Japan | 3-176544 |
| Sep. 2, 1991 | [JP] | Japan | 3-220871 |
| Dec. 20, 1991 | [JP] | Japan | 3-338739 |

[51] Int. Cl.$^5$ .................................. G11C 11/22
[52] U.S. Cl. ......................... 365/145; 365/149; 365/150; 365/182; 257/295; 257/300; 257/307
[58] Field of Search ............... 365/145, 149, 150, 182; 257/295, 306, 307, 409

[56] References Cited

U.S. PATENT DOCUMENTS

| 4,873,664 | 10/1989 | Eaton, Jr. ............................ 365/145 |
| 4,888,733 | 12/1989 | Mobley ............................... 365/145 |
| 5,046,043 | 7/1991 | Miller et al. ........................ 365/149 |
| 5,140,389 | 8/1992 | Kimura et al. ..................... 257/309 |

FOREIGN PATENT DOCUMENTS 2595160  7/1987  France ............... 365/149

*Primary Examiner*—Eugene R. LaRoche
*Assistant Examiner*—Huan Hoang
*Attorney, Agent, or Firm*—Nixon & Vanderhye

[57] ABSTRACT

A semiconductor memory device which comprises unit memory cells each including two transistors each having a source/drain region and a gate electrode and one capacitor having a capacitor dielectric film, an upper electrode and a lower electrode, the gate electrode of each transistor being connected to a common word line, one source/drain region of each transistor being connected to a bit line and a reversed bit line respectively and the other source/drain region being connected to the upper electrode and the lower electrode respectively, and the bit line, the reversed bit line and the word line being disposed under the lower electrode of the capacitor.

5 Claims, 9 Drawing Sheets

"1" Write

FIG. 6 (a)

"0" Write

FIG. 6 (b)

"1" Read

FIG. 6 (c)

"0" Read

FIG. 6 (d)

"1" Read

FIG. 6 (e)

"0" Read

FIG. 6 (f)

"1" Read
FIG. 7 (a)

"0" Read
FIG. 7 (b)

"1" Write

FIG. 13 (a) (PRIOR ART)

"0" Write

FIG. 13 (b) (PRIOR ART)

"1" Read

FIG. 13 (c) (PRIOR ART)

"0" Read

FIG. 13 (d) (PRIOR ART)

SEMICONDUCTOR MEMORY DEVICE HAVING TWO TRANSISTORS AND AT LEAST ONE FERROELECTRIC FILM CAPACITOR

BACKGROUND OF THE INVENTION

1. Field of the Invention

The invention relates to a semiconductor memory device, and more particularly to a semiconductor memory device comprising two transistors and one capacitor in an equivalent circuit.

2. Description of the Related Art

A hitherto known RAM with a simplest structure comprises one transistor and one capacitor and is designed to turn on and off the gate by means of the transistor to change the amount of charges of the capacitor, thereby storing information in desired memory cells.

Figure 11:
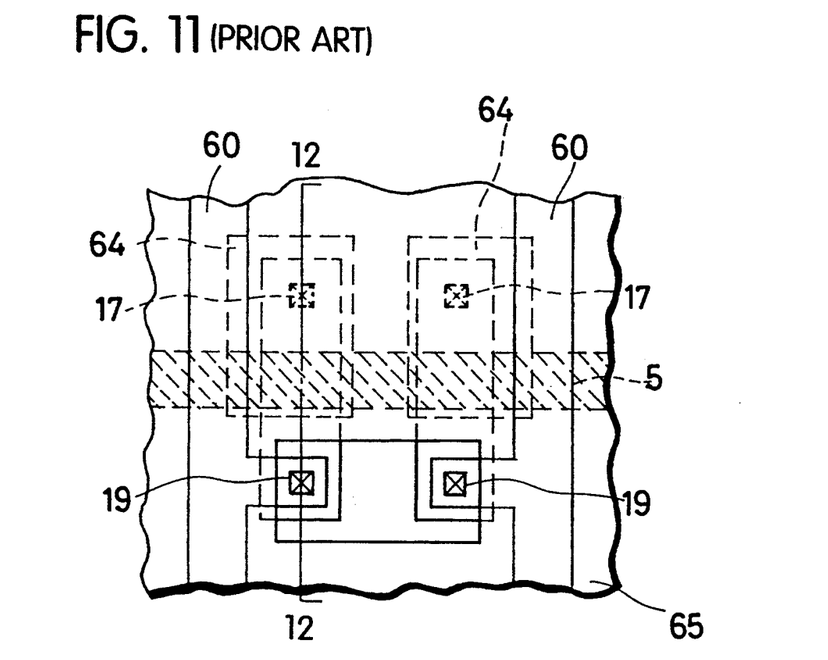
FIG. 11 is a plan view showing a conventional semiconductor memory device having 2 unit cells.
Figure 12:
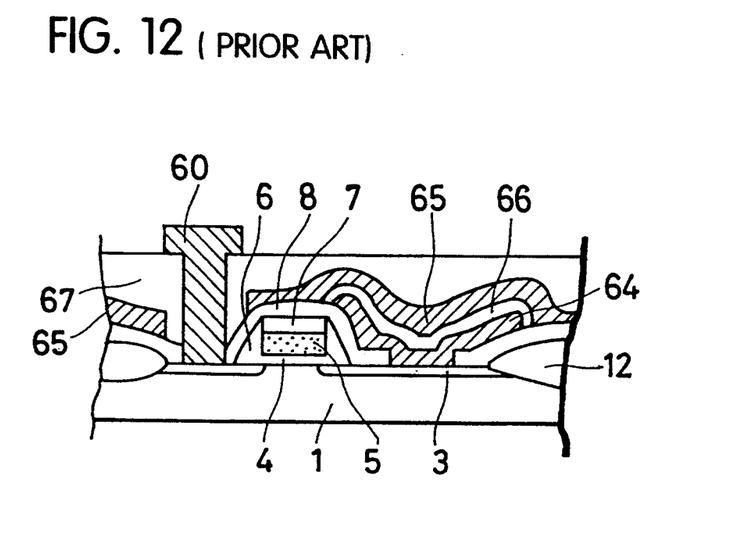
FIG. 12 is a schematic sectional view taken from the line 12—12 in FIG. 11.

FIG. 11 is a plane view showing RAM having 2 unit cells, each of which includes one transistor and one capacitor. FIG. 12 is a sectional view taken from line 12—12 of FIG. 11 showing the RAM which has the capacitor comprising lower and upper electrodes sandwiching therebetween a ferroelectric film of higher dielectric constant for achieving a larger capacity per unit area. In detail, a silicon substrate 1 is provided with a device-isolating region 12 to possess a device-forming region wherein a gate electrode 5 having side walls 6 and a protective film 7 is formed on the silicon substrate 1 through a gate oxide film 4 to behave as a word line, a source/drain region 3 extends on the surface of the silicon substrate 1 at both sides of the gate electrode 5, a capacitor lower electrode 64 having contact with the source/drain region 3 is layered above the gate electrode 5, source/drain region 3 and device-isolating region 12 through a dielectric film 8, a capacitor upper electrode 65 is layered on the lower electrode 64 through a ferroelectric film 66, an interlayer dielectric film 67 is deposited on the capacitor upper electrode 65, and a bit line 60 is connected to another part of source/drain region 3 opposite to that having contact with the capacitor electrode 64.

Figure 13:
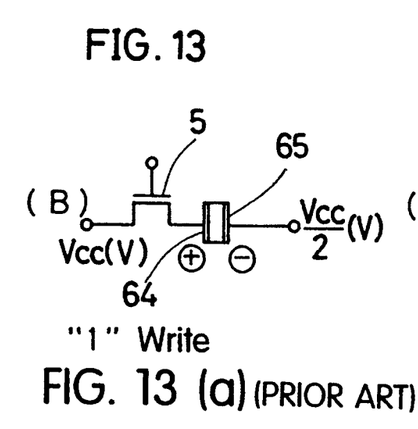
FIGS. 13(a)-13(d) are diagrams showing the states of capacitor of the conventional semiconductor memory device in writing and reading.

Next, operation of the RAM will be detailed with referring to FIG. 13.

The side having the upper electrode 65 opposite to the bit line (B) is first set to have electric potential of Vcc/2(V) before writing information. The bit line (B) is applied with Vcc(V) for writing "1" and with 0 (V) for writing "0" as shown in FIGS. 13(a) and 13(b). Residual polarization charges are stored in the capacitor with orientation of polarization being reversed as seen.

Also, for reading information, the side having the upper electrode 65 is first set to have electric potential of Vcc/2(V) and the bit line (B) is applied with Vcc(V). In reading "1", orientation of polarization of the capacitor is not reversed but the same as that in writing "1" as seen in FIGS. 13(a) and 13(c) to allow a flow of electric charge represented by the formula $I=(Ps-Pr)/\Delta t$ where Ps is saturated polarization charges, Pr residual polarization charges and $\Delta t$ reversing rates. In reading "0", orientation of polarization of the capacitor is reversed to that in writing "0" as shown in FIGS. 13(b) and 13(d) to largely change the amount of charges to a higher flow thereof as $I=\{2Pr+(Ps-Pr)\}/\Delta t=(Pr+Ps)/\Delta t$ than that in reading "1". Hence, "1" and "0" are read and determined in view of specific flow of the electric charges.

The above semiconductor memory device needs to enlarge capacity of the capacitor for keeping charges to be stored therein. Enlargement of capacity of the capacitor in the memory cell is inconsistent with decrease of sizes of the memory cell, leading to such a problem or task that various contrivances are used for reducing sizes of the memory cell.

There is also a problem wherein the capacitor upper and lower electrodes 64, 65 are positioned lower than and do not extend outward with respect to the bit line 60 as seen in FIG. 12, so that areas of the upper and lower electrodes 64, 65 in the memory cell are limited by the bit line 60 and a reversed bit line (not shown).

There is a further problem that the memory cell in which reading is carried out by determining specific flow of electric charges requires a dummy cell for the reading operation, so that the reading rate is limited.

The present invention has been designed to overcome the above problems. An object of the invention is to provide a reliable semiconductor memory device in which a circuit and structure of memory cell is simplified to achieve a larger capacity of the capacitor and reading can be carried out at a higher reading rate without use of a dummy cell.

SUMMARY OF THE INVENTION

The present invention provides a semiconductor memory device which comprises unit memory cells each including two transistors each having a source/drain region and a gate electrode and one capacitor having a capacitor dielectric film, an upper electrode and a lower electrode, the gate electrode of each transistor being connected to a common word line, one source/drain region of each transistor being connected to a bit line and a reversed bit line respectively and the other source/drain region being connected to the upper electrode and the lower electrode respectively, and the bit line, the reversed bit line and the word line being disposed under the lower electrode of the capacitor.

The present invention also provides a semiconductor memory device which comprises unit memory cells each including two transistors each having a source/drain region and a gate electrode and two capacitors each having a capacitor dielectric film, an upper electrode and a lower electrode, the upper electrodes and the capacitor dielectric films respectively being integrally formed, the gate electrode of each transistor being connected to a common word line, one source/drain region of the transistors being connected to a bit line and a reversed bit line and the other source/drain region being connected to each lower electrode of the capacitor, and the bit line, the reversed bit line and the word line being disposed under the lower electrodes of the capacitors.

DETAILED DESCRIPTION OF PREFERRED EMBODIMENTS

A dielectric film for a capacitor constituting a semiconductor device according to the present invention may use a ferroelectric film, such as PZT, PLZT or the like, preferably 50 to 3000Å in thickness.

The capacitor is formed at the upper part of the transistor, so that the word line may be arranged under the capacitor.

The lower and upper electrodes of capacitor may use polysilicon, Pt, W, Ti, TiW, TiN and various silicides, preferably 1000-5000Å in thickness for lower electrodes and 500-3000Å thick for upper ones.

The gate electrode may use polysilicon, silicide or the like, preferably 500 to 2500Å in thickness, and the bit line and the reversed bit line may use polysilicon, silicide or metals, such as W, Ti, Al-Si or the like, preferably 1000 to 4000Å thick.

Also, oxide films, such as $SiO_2$, $SiO_2/SiN$ or the like may be used preferably 500-5000Å in thickness Next, an example of RAM comprising two transistors and one capacitor according to the present invention will be detailed with referring to the accompanied drawings.

Figure 1:
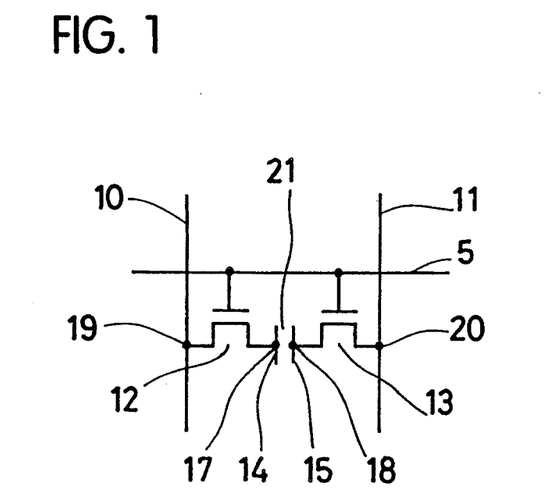
FIG. 1 is a diagram of an equivalent circuit showing an example of a semiconductor memory device according to the present invention.
Figure 2:
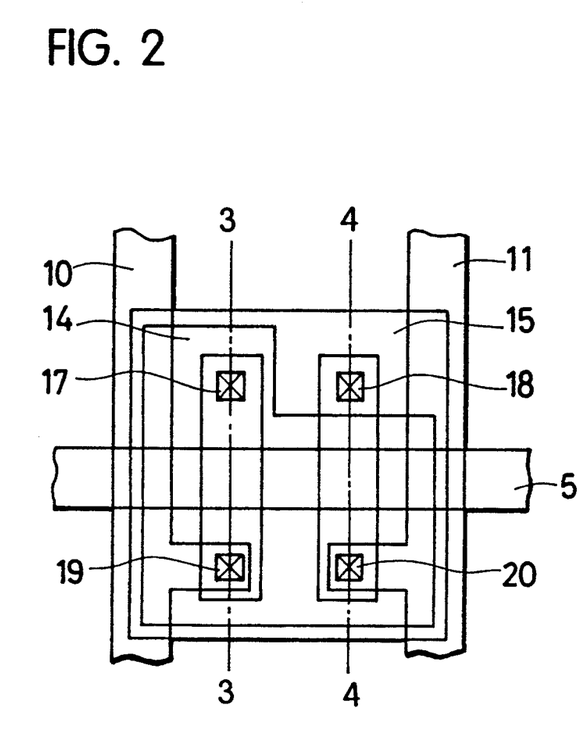
FIG. 2 is a schematic plan view showing an example of the semiconductor memory device in FIG. 1.

As seen in FIGS. 1 and 2, gate electrodes of two MOS transistors in the RAM of this example are connected to a common word line 5. One source/drain region of each transistor 12, 13 is connected to a bit line 10 and a reversed bit line 11 and the other source/drain regions of the transistors are connected to each other through a capacitor 21. The capacitor 21 comprises a dielectric film made, for example, of a ferroelectric film (not shown) such as PZT or the like, an upper electrode 15 and a lower electrode 14 to which electrodes 14, 15 the above other source drain regions of the transistors 12, 13 are connected.

Further detailed explanation will be given with referring to FIG. 3(d) a sectional view taken from the line 3—3 in FIG. 2. A silicon substrate 1 is provided with a device-isolating region 2 to possess a device-forming region wherein source/drain regions 3 are first formed on the surface of the silicon substrate 1. A gate electrode 5 having a side wall 6 is layered on the silicon substrate 1 between the source/drain regions 3 through a $SiO_2$ film 4 behaving as a gate oxide. A first SiO2 film 7 is deposited on the gate electrode 5 and a second $SiO_2$ film 8 is layered on the gate electrode 5 and the first $SiO_2$ film 7. A bit line 10 is formed on and connected to one source/drain region 3 and a third $SiO_2$ film 9 is provided above the gate electrode 5 and the bit line 10. A capacitor lower electrode 14 is formed on the third $SiO_2$ film 9 to extend over the gate electrode 5 and the bit line 10 and be connected to the source/drain region 3 opposite to that connected to the bit line 10. Also, a capacitor upper electrode 15 is layered on the lower electrode 14, for example, through a PZT film 16 serving as a dielectric film for the capacitor.

Figure 3:
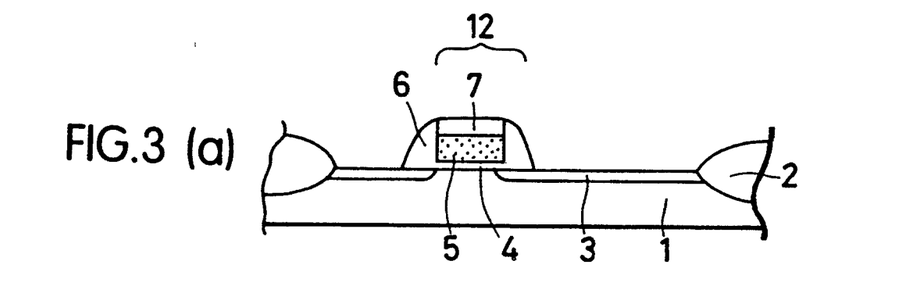
FIGS. 3(a)–3(d) are schematic sectional views taken from the line 3—3 in FIG. 2, showing a manufacturing process of a semiconductor memory device according to the present invention.
Figure 4:
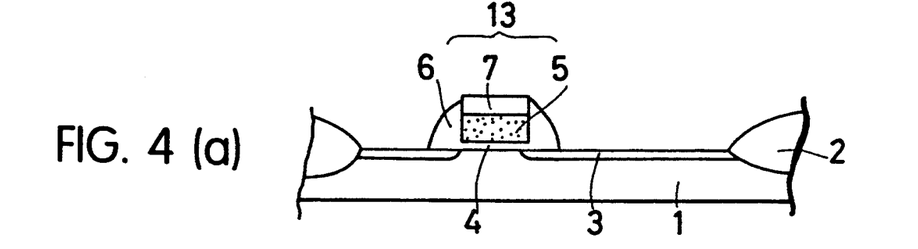
FIGS. 4(a)–4(d) are schematic sectional views taken from the line 4—4 in FIG. 2, showing a manufacturing process of a semiconductor memory device according to the present invention.

Next, a manufacturing method of the RAM constructed above will be detailed with referring to FIGS. 3 and 4. FIG. 3 is a schematic sectional view taken from the line 3—3 in FIG. 2 and FIG. 4 a schematic sectional view taken from the line 4—4 in FIG. 2.

A LOCOS device-isolating region 2 is first formed on the p-type silicon substrate 1, and a $SiO_2$ film 4, 100Å thick, serving as a gate oxide, polysilicon and $SiO_2$, 1000Å thick, respectively are deposited in the order by customary methods and processed by photo-etching to form the gate electrode 5 and the first $SiO_2$ film 7. For example, P is then applied at density of $1 \times 10^{15} cm^{-2}$ by ion implantation technique using the gate electrode 5 and the first SiO2 film 7 as a mask to form the source/drain regions 3. Then, $SiO_2$ is layered approximately 1500Å on the gate electrode 5 and the first $SiO_2$ film 7 to provide the side wall 6 by RIE method (FIG. 3(a) and FIG. 4(a)).

After a second $SiO_2$ film 8 is deposited approximately 1000Å on the silicon substrate 1, contact portion 19 between the bit line 10 and a first transistor 12 and that 20 between a reversed bit line 11 and a second transistor 13 are opened by photo-etching process. Polysilicon may be layered on the silicon substrate 1 and etched by customary methods to form the bit line 10 and the reversed bit line 11. Further, a third $SiO_2$ film 9 is layered approximately 1000Å on the bit line 10, reversed bit line 11 and gate electrode 5 (FIG. 3(b) and FIG. 4(b)).

A contact portion 17 between the first transistor 12 and a capacitor lower electrode 14 to be formed later is opened in the third $SiO_2$ film 9 and the second $SiO_2$ film 8 by photo-etching process (FIG. 3(c)), on which W may be deposited approximately 3000Å and processed by photo-etching to form a desired lower electrode 14. PZT is layered approximately 1000Å on the lower electrode 14 to behave as a capacitor dielectric film. A contact portion 18 between a second transistor 13 and a capacitor upper electrode 15 to be provided later is opened in the PZT film 16, third $SiO_2$ film 9 and second $SiO_2$ film 8 by photo-etching process (FIG. 4(c)), on which W may be deposited approximately 1500Å and etched in the same manner as above to form the upper electrode 15.

NSG (not shown), approximately 1500Å and BPSG (not shown), approximately 6000Å, each serving as interlayer dielectric, are layered on the upper electrode 15 to form a memory cell.

In the above example, the contact portion 19 between the first transistor 12 and the bit line 10 and contact 20 between the second transistor 13 and the reversed bit line 11 are arranged in a row on the same side with respect to the word line 5. The contact portions 17 and 18 between the first transistor 12 and the capacitor lower electrode 14 and between the second transistor and the upper electrode 15, respectively, shown in FIG.

Figure 5:
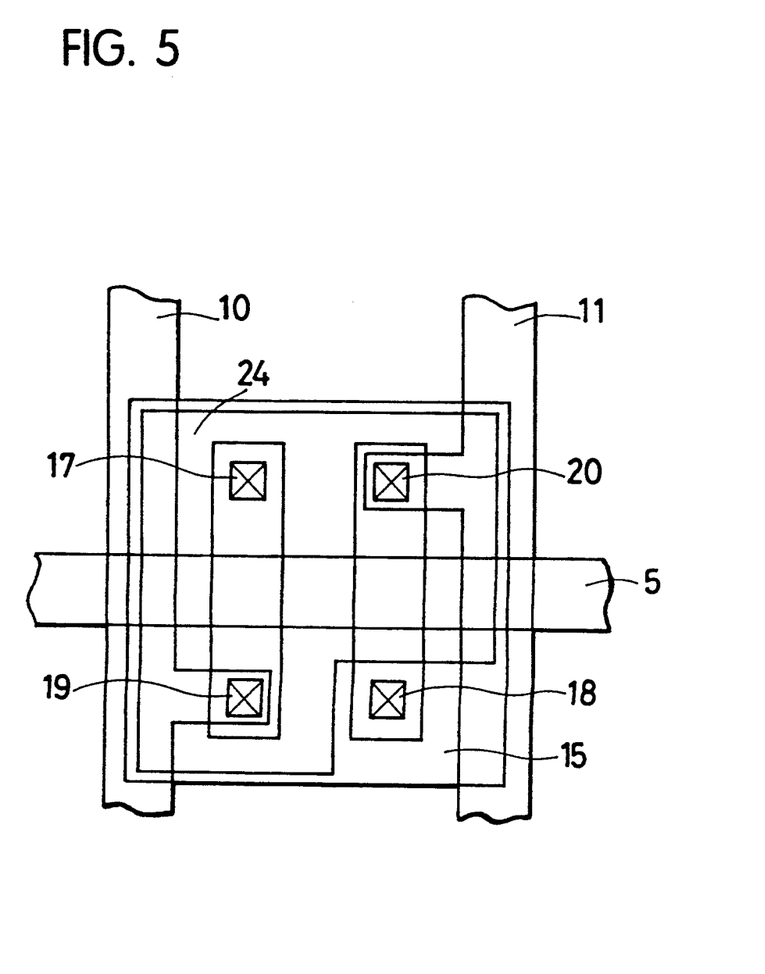
FIG. 5 is a plan view showing a modified example of a semiconductor memory device according to the present invention.

2 may be shifted in position with the contact portions 19 and 20 between the first transistor and the bit line 10 and between the second transistor 13 and the reversed bit line 11, respectively with respect to the word line 5. Also, as shown in FIG. 5, the contact portions 19 and 20 may be placed at separate sides with respect to the word line 5.

Writing and reading operation in the RAM constructed above will be detailed hereunder.

Figure 6:
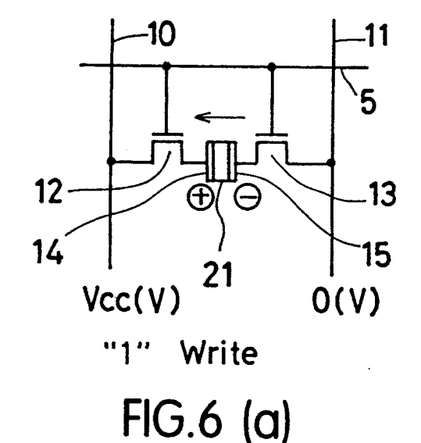
FIGS. 6(a)-6(f) are diagrams showing the states of capacitor in writing and reading.

For writing "1", the bit line 10 is set to have Vcc(V) and the reversed bit line 11 to have 0(V), and the word line 5 is activated. In this case, polarization is oriented, as shown in FIG. 6(a), in a direction extending from the upper electrode 15 to the lower electrode 14 by residual charges. For writing "0", the bit line 10 is set to have 0(V) and the reversed bit line 11 to have Vcc(V), and the word line 5 is activated. In this case, polarization is oriented, as shown in FIG. 6(b), in a direction extending from the lower electrode 14 to the upper electrode 15 by residual charges. In case that it is possible to reverse orientation of polarization, voltage to be applied should not be limited to Vcc(V).

In reading by use of residual charges, the bit line 10 and the reversed bit line 11 are first set to have electric potential of Vcc/2(V) and the word line 5 is activated, so that the bit line 10 and the reversed bit line 11 are caused, as shown in FIGS. 6(c) and 6(d), to have such potential difference corresponding to specific residual charges as $\pm Vr = \pm Qr/C$ where $\pm Qr$ is residual charges and C capacity of the bit line, et al. Sensing operation is then directly carried out to read "1" or "0" corresponding to orientation of polarization. Initial potential of the bit line 10 and the reversed bit line 11 in reading is not limited to Vcc/2(V) but may be set at discretion as well as those are sensible.

Figure 7:
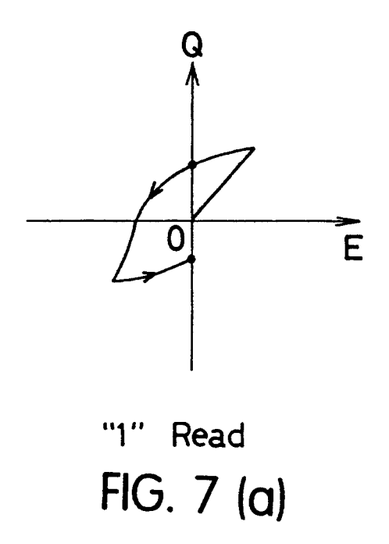
FIGS. 7(a) and 7(b) are diagrams showing hysteresis properties of capacitor using polarization reversal in reading.

In reading by use of reversal of polarization, the bit line is set to have Vcc(V) or 0(V) and the reversed bit line 11 to have Vcc(V) or Vcc/2(V), and the word line 5 is activated. FIGS. 7(a) and 7(b) shows hysteresis properties of the capacitor in reading "1" and "0" by use of reversal of polarization. When "1" is read, polarization is reversed as seen in FIG. 7(a) and the amount of charges change. In reading "0" there occurs no reversal of polarization as shown in FIG. 7(b) and the amount of charges do not change substantially. Hence, reversal of polarization may be used to determine "1" or "0" in view of a change of electric current or potential due to fluctuation of the amount of charges. In this case, potential at the bit lines 10 and 11 for reading may be set at discretion, provided that the set values of potential causes reversal of polarization in reading one of "1" and "0" and not cause the same in reading the other.

By sensing potential difference between the bit line 10 and the reversed bit line 11, reading can be carried out directly without use of any dummy cells. Also, use of the ferroelectric film as a dielectric film for the capacitor ensures a relevant capacitor capacity on the device-isolating region for providing a sufficient memory capacity.

Also, the capacitor 21 can be achieved in the whole surface area of the memory cell except processing allowance and matching margin without areas of the lower and upper electrodes 14 and 15 being limited by the bit line 10 and the reversed bit line 11, thereby enabling a further larger capacity of the capacitor. Also, the capacitor 21 may be prepared after formation of the bit line 10, reversed bit line 11 and word line 5. Hence, when the capacitor dielectric uses a ferroelectric film which is relatively sensitive to high temperature, there is no need of heat treatment for a formed dielectric film at a higher temperature than that in deposition of the ferroelectric film, so that deterioration of properties of the ferroelectric film is prevented.

Figure 8:
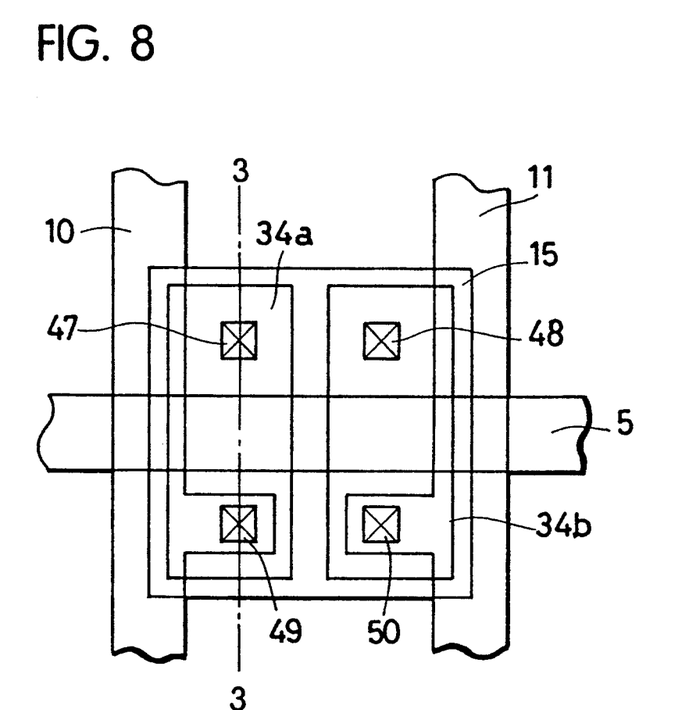
FIG. 8 is a plan view showing a further modified example of a semiconductor memory device according to the present invention.
Figure 9:
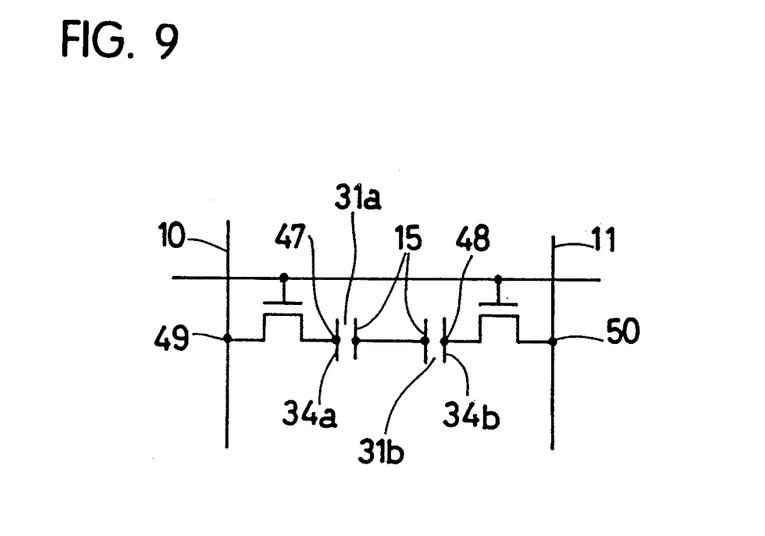
FIG. 9 is a diagram of an equivalent circuit of a semiconductor memory device shown in FIG. 8.

Modified examples will be detailed with referring to FIGS. 8 and 9.

The examples are different from the foregoing example in that the capacitor lower electrode is formed in the substantially whole area of the memory cell in a manner of being divided in two as shown to provide lower electrodes 34a and 34b.

The RAM constructed above will be explained in view of FIG. 3.

In the same manner as that of the foregoing example, source/drain regions 3 are formed on the silicon substrate 1, on which a SiO2 film 4, a gate electrode 5, a first SiO2 film 7, a side wall 6, a second SiO2 film 8, a bit line 10 and a third SiO2 film 9 are layered in the order (FIGS. 3(a) and 3(b)).

A contact portion 47 between a first transistor 12 and a capacitor lower electrode 34a to be formed later and a contact portion 48 between a second transistor 13 and a lower electrode 34b to be provided later are opened by photo-etching process, on which W may be layered approximately 3000Å and processed by photo-etching to form the first lower electrode 34a and the second one 34b (FIG. 3(c)).

A PZT film 16 is layered on the first and second lower electrodes 34a and 34b in the whole area of the memory cell, on which W is layered approximately 1500Å and etched in the same manner as above to form a capacitor upper electrode 15. In this case, there is no need of etching of the PZT film 16 in the memory cell.

NSG (not shown), approximately 1500Å thick, and BPSG (not shown), approximately 6000Å thick, serving as interlayer dielectric are layered on the upper electrode 15 to complete the memory cell.

Figure 10:
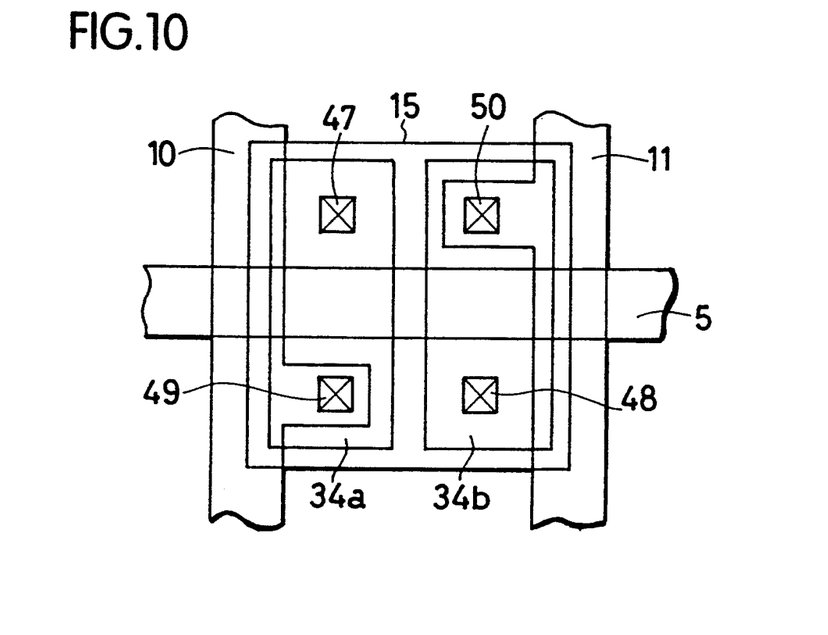
FIG. 10 is a plan view showing a further modified example of a semiconductor memory device according to the present invention.

In the above example, the contact portion 49 between the first transistor 12 and the bit line 10 and contact 50 between the second transistor 13 and the reversed bit line 11 are arranged in a row on the same side with respect to the word line 5. The contact portions 47 and 48 between the first transistor 12 and the capacitor first lower electrode 34a and between the second transistor 13 and the second lower electrode 34b, respectively, shown in FIG. 9 may be shifted in position with the contact portions 49 and 50 between the first transistor 12 and the bit line 10 and between the second transistor 13 and the reversed bit line 11, respectively with respect to the word line 5. Also, as shown in FIG. 10, the contact portions 49 and 50 may be placed at separate sides with respect to the word line 5.

As seen, the two upper electrodes and two dielectric films respectively are integrally provided and the lower electrode is divided in two to provide the lower electrodes 34a and 34b. Hence, there is no need of processing for the capacitor dielectric film made of a ferroelectric film directly connecting the upper electrode 15 and the source/drain region 3 on the substrate, thereby enabling a semiconductor memory device of high reliability to be manufactured at a higher yield.

What we claimed is:

1. A semiconductor memory device which comprises unit memory cells each including two transistors each having a source/drain region and a gate electrode and one capacitor having a capacitor dielectric film, an upper electrode and a lower electrode, the gate electrode of each transistor being connected to a common word line, one source/drain region of each transistor being connected to a bit line and a reversed bit line respectively and the other source/drain region being connected to the upper electrode and the lower electrode respectively, and the bit line, the reversed bit line and the word line being disposed under the lower electrode of the capacitor, wherein the capacitor dielectric film uses a ferroelectric film.

the capacitor lower electrode is formed to cover said two transistors except for the region connecting the upper electrode to said other source/drain region, and the capacitor upper electrode covers the entire surface of said two transistors.

2. A semiconductor memory device as set forth in claim 1, wherein the capacitor upper and lower electrodes are disposed over the bit line, the reversed bit line and the word line and are substantially equal in size to area of a unit memory cell.

3. A semiconductor memory device which comprises unit memory cells each including two transistors each having a source/drain region and a gate electrode and two capacitors each having a capacitor dielectric film, an upper electrode and a lower electrode, the upper electrodes and the capacitor dielectric films respectively being integrally formed, the gate electrode of each transistor being connected to a common word line, one source/drain region of each transistor being connected to a bit line and a reversed bit line respectively and the other source/drain region being connected to each lower electrode of the capacitor, and the bit line, the reversed bit line and the word line being disposed under the lower electrodes of the capacitors and wherein the capacitor dielectric film uses a ferroelectric film.

4. A semiconductor memory device as set forth in claim 3, wherein the capacitor upper and lower electrodes are disposed over the bit line, the reversed bit line and the word line and are substantially equal in size to area of a unit memory cell.

5. A semiconductor memory device as in claim 3 wherein the two capacitor lower electrodes respectively cover the entire surface of the transistor connected to the capacitor lower electrodes, and the upper electrode is integrally formed on the entire surface of the two transistors.

* * * * *